United States Patent [19]

Koppensteiner

[11] 4,427,254

[45] Jan. 24, 1984

[54] PRINTED WIRING CARD STIFFENER BRACKET

[75] Inventor: James V. Koppensteiner, Chicago, Ill.

[73] Assignee: GTE Automatic Electric Labs. Inc., Northlake, Ill.

[21] Appl. No.: 328,299

[22] Filed: Dec. 7, 1981

[51] Int. Cl.³ .............................................. H05K 5/00
[52] U.S. Cl. ............................... 339/108 R; 339/17 C
[58] Field of Search ............ 339/17 R, 17 C, 17 LM, 339/17 M; 361/395, 399, 415

[56] References Cited

U.S. PATENT DOCUMENTS 3,200,361  8/1965  Schwartz et al. .............. 361/399 X
3,851,222  11/1974  Michalak et al. .................. 361/399

Primary Examiner—Eugene F. Desmond
Attorney, Agent, or Firm—Anthony Miologos; Robert J. Black

[57] ABSTRACT

A printed wiring card stiffener bracket including a handle portion and a stiffener frame portion having novel slotted tab and fastener arrangements for securing the stiffener bracket to the printed wiring card. The stiffener frame portion includes blade arms which bear against the printed wiring card preventing distortion and warpage of the card and assisting in the insertion of the card in a card file.

3 Claims, 2 Drawing Figures

4,427,254

PRINTED WIRING CARD STIFFENER BRACKET

BACKGROUND OF THE INVENTION (1) Field of the Invention:

The present invention relates generally to the field of supporting and strengthening printed circuit boards and more particularly to a new and novel printed wiring card stiffener bracket.

(2) Description of the Prior Art:

Large dimensioned printed wiring cards are subject to warpage and linear distortion once they are equipped with fairly heavy components and automatically soldered. Such distortion and warpage makes it difficult but not impossible to insert the card into a card file and also to mate properly with a respective connector. To avoid such linear distortion and warpage and also to assist in the insertion of the card, a stiffener frame or bracket is necessary.

Many support structures of the prior art such as U.S. Pat. No. 3,216,580 which issued to F. V. Fricker, Jr., on Nov. 9, 1965, U.S. Pat. No. 3,539,879 which issued to A. W. Bradley, et al., on Nov. 10, 1970, and Swiss Patent No. 377,902 utilize grooved wrap around frame. Such arrangements are normally unsuitable since these support structures either form a portion of the connector or the card file support frame and either interfere with the use of the printed wiring card and normal card file structures or do not provide adequate support due to the tolerances required to allow sliding of a card.

Another structure of the prior art disclosed in German Pat. No. 1,195,829 utilizes a frame type stiffener which supports the entire perimeter of the printed wiring card having engaging tabs which fit through the printed wiring card which are bent over on the opposite side of the card. Such an arrangement is normally unsuitable do to the excessive land areas required by the stiffener frame and the inconsistencies inherent in bending tabs to provide support.

The prior art stiffener bracket assembly disclosed in U.S. Pat. No. 3,851,222, requires the modification of the printed wiring card by the addition of slots along the edges to engage tabs on the stiffener frame. This type of modification to the printed wiring card cannot be accomplished in the field.

Accordingly it is a principle object of the present invention to provide a printed wiring card stiffener bracket which may be utilized with standard card files and connector arrangements and with a minimum modification to the wiring card to prevent card distortion and for assisting in the insertion of the card in a card file.

SUMMARY OF THE INVENTION

The objective of the present invention is achieved by providing a printed wiring card stiffener bracket which includes a handle portion and a stiffener frame portion which corresponds to the dimensions of the printed wiring card to be supported. The handle portion is normally mounted on the card edge which faces outward of a card file assembly. The stiffener frame portion includes a plurality of blade arms extending downward from the stiffener frame each resting near the edge of the surface of the printed wiring card adjacent the handle portion edge. The blade arms bear against the surface of the card and straighten the card if it is bowed. It has been experienced that wiring cards are normally bowed in the direction toward the solder side of the card.

The bracket is completed by a pair of corner members each including U-shaped slots on their ends which are arranged to accept within the slots the circuit board edge opposite the handle. The stiffener frame portion mounts to the handle portion on one end and to the printed wiring card via the slotted corner members on an opposite end.

BRIEF DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
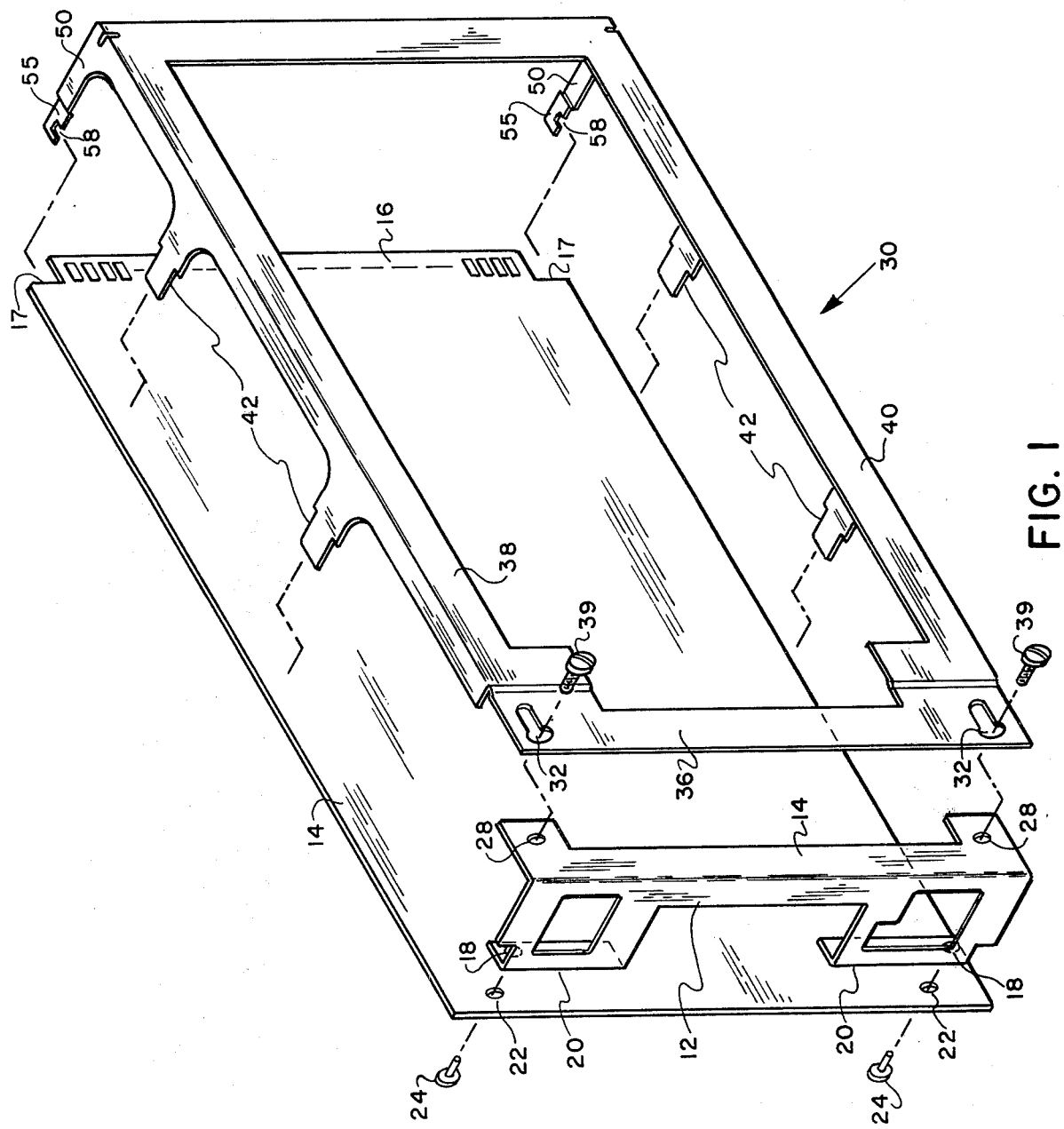
FIG. 1 is a perspective view of the printed wiring card stiffener bracket of the present invention in position to be attached to the printed wiring card.
Figure 2:
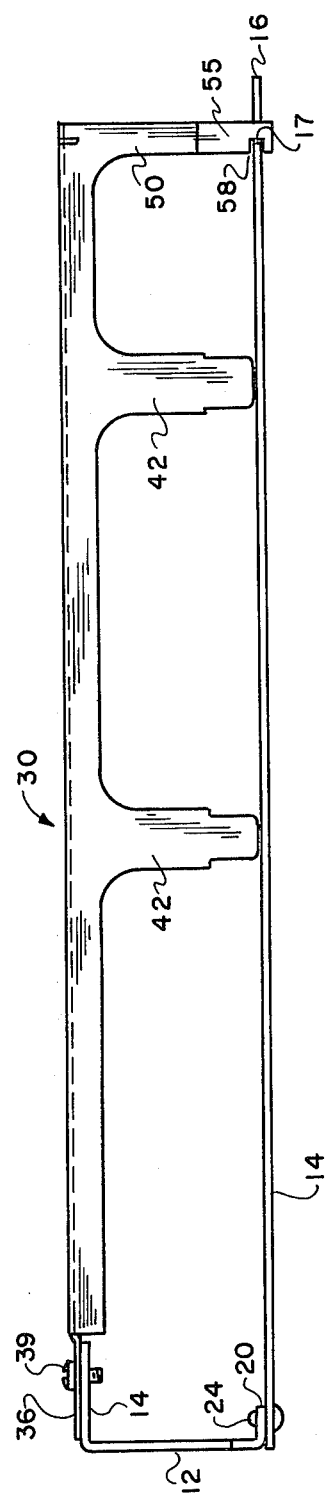
FIG. 2 is a side elevation of the printed wiring card stiffener bracket installed on a printed wiring card.

The printed wiring card stiffener bracket illustrated in FIGS. 1 and 2 includes handle portion 12 which is approximately the width of the printed circuit card 14 which is the edge opposite the connector portion 16 of the printed wiring card 14. A pair of holes 18 are located along bottom ledge sections 20 of the handle portion 12 that are in alignment with a similar number of holes 22 in the printed wiring card 14. Threaded fasteners 24 or other suitable connecting devices are inserted through the aligned holes 18 and 22 with the fasteners securing the stiffener bracket to the printed wiring card 14 as will be explained in detail hereinafter.

The handle portion 12 further includes a top ledge 14 having a pair of holes 28 thereon. Ledge 14 is arranged to accept a section 36 of stiffener frame portion 30 thereon. Holes 28 align with holes 32 on stiffener portion 30 and are attached via threaded fasteners 39.

Stiffener frame 30 further includes sections 38 and 40 which are in alignment with the edges of the printed wiring card 14. At intervals along sections 38 and 40, for example every 5 inches along a 13 inch printed wiring card, blade arms 42 are provided which are adapted to rest on the surface of printed wiring card 14. The ends of arms 42 may further include a boot made of insulating material in order to isolate the stiffener bracket from the printed wiring card. Finally, the stiffener frame portion 30 includes corner members 50 each including inwardly bent tabs 55 and circuit boards accepting slots 58. Each slot 58 is arranged to accept a respective outboard edge portion 17 of edge 16 therein.

The printed wiring card stiffener bracket may be formed from aluminum or other suitable metal having the desired characteristics of tensile strength and rigidity. While the present embodiment describes a stiffener bracket having blade arms 42 and stiffener frame 30 formed of a integral strip of material, it should be noted that various other fabrication techniques may be also suitable.

To assemble the stiffener bracket and printing wiring card 14, handle portion 12 is first installed on the printed wiring card by aligning holes 18 to holes 22 and sewring via fasteners 24. It should be noted that holes 22 are usually found on a printed wiring card and are the means for attaching a printed wiring card handle. The stiffener frame portion is attached to the handle portion and the printed wiring card by first engaging respective outboard edge portions 17 of circuit board 14 into slots 55 of members 50 and resting blade arms 42 on the surface of the printed wiring card as seen in FIG. 2. With portions 17 firmly seated in respective slots 58 fasteners 39 are used to lock stiffener bracket 30 to handle 12 via aligned holes 28 and 32.

The printed wiring card stiffener bracket of the present invention provides support and rigidity to printed wiring card by means of blade arms that rest against the surface edges of the printed wiring card. The blade arms prevent linear distortion and warpage as well as assist in the insertion of the printed wiring card in a card file rack. Normally, when the printed wiring card warps or distorts it usually distorts toward the solder side of the card. Therefore arms 42 straighten the card if warpage occurs. The method of mounting the stiffener bracket to the printed wiring card allows the edges of the printed wiring card to slide into standard card file guides without interference while the flat blade arms result in a minimum loss to cards component mounting area. The stiffener bracket mounts to the printed wiring card with a minimum of alteration to the card and in most cases can be installed without any wiring card modification whatsoever. The assembled stiffener bracket and printed wiring card then form an assembly of high strength which allows the handling of the assembly without strain to either part of the bracket or card.

The present invention has been described with reference to a specific embodiment thereof, for the purpose of illustrating the manner in which the invention may be used to advantage. It would be appreciated by those skilled in the art that the invention is not limited thereto. Accordingly, any and all modifications, variations, or equivalent arrangements which may occur to those skilled in the art should be considered to be within the scope of the invention.

What is claimed is:

1. A printed wiring card stiffener bracket comprising:
    a handle portion extending along the edge of a printed wiring card to be stiffened that is exposed when the card is inserted into a card file, said handle portion including means mounting the handle portion to the printed wiring card; and,
    a stiffener portion extending along the remaining edges of the printed wiring card and including means for mounting said stiffener portion to said handle portion, said stiffener portion further including a plurality of blade arms resting on the edges of the printed wiring card that adjoin the handle portion at intervals suitable to stiffen said printed wiring card and prevent warpage and linear distortion, and a pair of corner members each including L-shaped tab portions having a slot arranged to engage and accept therein the printed wiring card edge opposite said handle portion, whereby said stiffener bracket is retained to said printed wiring card.

2. The printed wiring card stiffener bracket as recited in claim 1, wherein: the printed wiring card edge where said handle portion is mounted includes at least a pair of apertures and said handle portion includes a pair of apertures in alignment with said printed wiring card apertures whereby said handle portion mounting means are at least a pair of threaded fasteners each arranged to be accepted within a different one of said pair of aligned apertures, mounting said handle portion to said card.

3. The printed wiring card stiffener bracket as recited in claim 1, wherein: said handle portion includes a second pair of apertures aligned with an associated pair of apertures on said stiffener portion whereby said stiffener portion mounting means are at least a pair of threaded fasteners each arranged to be accepted within a different one of said pair of aligned apertures mounting said stiffener bracket to said handle.

* * * * *